United States Patent
Vashchenko et al.

(10) Patent No.: US 7,141,831 B1
(45) Date of Patent: Nov. 28, 2006

(54) SNAPBACK CLAMP HAVING LOW TRIGGERING VOLTAGE FOR ESD PROTECTION

(75) Inventors: Vladislav Vashchenko, Palo Alto, CA (US); Peter J. Hopper, San Jose, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 170 days.

(21) Appl. No.: 10/900,709

(22) Filed: Jul. 28, 2004

(51) Int. Cl.
*H01L 29/74* (2006.01)

(52) U.S. Cl. .................. 257/124; 257/141; 257/173; 257/355; 257/367

(58) Field of Classification Search ............... 257/124, 257/141, 367
See application file for complete search history.

(56) References Cited

U.S. PATENT DOCUMENTS

| | | | |
|---|---|---|---|
| 6,365,932 B1 * | 4/2002 | Kouno et al. ............... | 257/341 |
| 6,690,066 B1 * | 2/2004 | Lin et al. .................... | 257/355 |
| 6,777,721 B1 * | 8/2004 | Huang et al. ............... | 257/111 |
| 6,972,463 B1 * | 12/2005 | Cheng ........................ | 257/365 |
| 2002/0175377 A1 * | 11/2002 | Lin ............................. | 257/355 |

* cited by examiner

*Primary Examiner*—Hoai Pham
*Assistant Examiner*—John Ingham
(74) *Attorney, Agent, or Firm*—Girard & Equitz LLP

(57) ABSTRACT

An SCR device having a first P type region disposed in a semiconductor body and electrically connected to anode terminal of the device. At least one N type region is also disposed in the body adjacent the first P type region so as to form a PN junction having a width Wn near a surface of the semiconductor body. A further P type region is also disposed in the body to form a further PN junction with the N type region, with the junction having a width Wp near the body surface, with Wp being at least 1.5 times width Wn. A further N type region is provided which is electrically connected to a cathode terminal of the device and forming a third PN junction with the further N type region.

23 Claims, 9 Drawing Sheets

SNAPBACK CLAMP HAVING LOW TRIGGERING VOLTAGE FOR ESD PROTECTION

BACKGROUND OF THE INVENTION

1. Field of the Invention

The present invention relates generally to apparatus for protecting circuits from Electro Static Discharge (ESD) and, in particular, a snapback circuit capable of being triggered at low voltages.

2. Description of Related Art

An integrated circuit may be subjected to an ESD event that can damage or destroy circuitry of the integrated circuit. Various types of ESD clamps have been devised which are typically connected in parallel to the circuitry to be protected and operate to shunt current around the circuitry to be protected during an ESD event. In order to provide effective protection while not interfering with the normal operation of the integrated circuit, the design of the ESD clamp must, among other things, take into account the breakdown voltage of the circuit to be protected and the normal operating voltage of the circuit. Normal operating voltages should not be sufficient to trigger the ESD clamp. Further, after the occurrence of an ESD event, the protection circuit should disengage, that is, unlatch, once normal operating voltages return. Recent developments in the design of integrated circuits, including reduced power supply voltages, increased operating frequencies, smaller device geometries and smaller breakdown voltages have made the design of effective ESD clamp and other protection circuits more difficult.

FIG. 1 shows a curve 10 that represents the voltage-current (V-I) characteristics of a typical ESD clamp circuit, sometimes referred to as a snapback clamp. Curves 12 and 14 which represent the characteristics of two typical devices to be protected. The primary objective of the ESD clamp circuit is to rapidly respond to an ESD event by shunting the large current (typically a few amperes) away from the circuit to be protected so that any voltages generated in the circuit to be protected are sufficiently small to avoid damage or destruction of the circuit. Further, the ESD clamp circuit must not be triggered during normal operation and should unclamp at the end of the event so that normal operation can resume, as previously noted.

Referring to FIG. 1, an ESD event will cause the voltage across the clamp circuit and protected circuit to rapidly increase. The ESD event will produce a current having a magnitude of $I_{ESD}$, which, as previously noted can be as large as a few amperes. As the voltage across the clamp and the circuit increases, the claim will start to turn on significantly, that is trigger, at point 10A of curve 10. The typical clamp will then enter a negative resistance area of operation and will continue conducting an increasing current until the voltage across the clamp has been reduced to a holding voltage indicated by point 10B. The clamp current will ideally continue to increase until the current reaches the maximum current $I_{ESD}$ at point 10C. If the maximum $I_{ESD}$ current is too large for the clamp, the clamp will eventually reach a breakdown voltage at point 10D, with any additional current causing the clamp to be damaged or destroyed.

Assuming that the circuit to be protected represented by curve 12 is subjected to the same ESD event, without the presence of the clamp circuit, the circuit to be protected would begin conducting current as indicated by point 12A of the curve. The circuit would continue to conduct current until it suffered a voltage break down at point 12B, with the increasing ESD current causing the circuit to be destroyed.

However, assuming that the ESD clamp is in place, the clamp will be triggered at a voltage at point 10A that is lower than the voltage at point 12A of the circuit to be protected. Thus, the ESD clamp will prevent the circuit to be protected from being exposed to a voltage sufficiently high to cause the circuit to break down and will cause all of the ESD current to be bypassed through the clamp.

The alternative circuit to be protected, having I-V characteristics represented by curve 14, will start to breakdown at point 14A. Since the voltage at point 14A is lower than the trigger voltage of the ESD clamp at point 10A, the clamp will not turn on during the event. As a result, the clamp will not be capable of protecting the circuit from the ESD event.

Although there are a wide variety of circuits that can be used as ESD clamps, silicon controlled rectifiers (SCR) are frequently used for this application. FIGS. 2A and 2B depict one conventional implementation of an SCR type clamp circuit commonly used in ESD application. The FIG. 2A, 2B structure is sometimes called a low voltage triggered silicon controlled rectifier (LVTSCR). The exemplary LVTSCR is formed in a P type substrate 18. An N well 20 is formed in the substrate 18, with an N+ region 22 forming a contact to the N well. A P+ region 24 also formed in the N well 20, is separated from the N+ region by a shallow trench isolation (sti) region 26A. An N+ extension 20A is formed near one end of the N well 20 and is separated from P+ region 24 by a further shallow trench isolation region 26B. Respective N+ and P+ regions 22 and 24 are electrically interconnected by a metal track 28, with this connection forming the anode terminal of the LTVSCR. As can best be seen in FIG. 2B, metal track 28 is electrically connected to N+ region 22 and P+ region 24 by way of a plurality of respective contact openings 22A and 24A formed in the oxide layer (not designated) disposed over those regions.

A further N+ region 30 is formed in the P substrate 18 and spaced apart from the extension 20A so as to form a channel region 18A intermediate the N+ regions 30 and 20A. A polysilicon gate 32 is disposed over the channel region 18A and separated from the channel regions by a thin gate oxide (not designated). A P+ region 34 is formed in the P substrate 18 and separated from region 30 by a shallow trench isolation region 26C, with P+ region 34 forming a contact with the P substrate 18. P+ region 34 and N+ region 30 are connected together by a metal track 36 which forms the cathode of the LVTSCR 16. Again as can best be seen in FIG. 2B, metal track 36 is electrically connected to N+ region 30 and P+ region 34 by way of a plurality of respective contact openings 30A and 34A formed in the oxide layer (not designated) disposed over those regions.

LVTSCR 16, as is the case for all SCR type structures, can be viewed as a PNP transistor combined with an NPN transistor, with the base of the PNP transistor and the collector of the PNP transistor being common and the collector of the PNP and the base of the NPN being common. P+ region 24, N well 20 and P substrate 18 form the respective emitter, base and collector regions of the PNP device. The N well region 20 further defines a resistor having one terminal which is part of the base on the PNP and a second terminal which is connected to the emitter by way of N+ region 22 and metal track 28. The NPN device includes the N+ region 30, the P substrate 18 and the N well 20 which form the emitter, base and collector of the device. A resistor is formed in the P substrate 18 having one terminal that is part of the NPN base region and a second terminal connected to the emitter by way of P+ region 34 and metal track 36.

In operation, at the beginning of and ESD event, when the voltage is low, the PN junction between N well 20 and the P substrate 18 is slightly reversed biased. This reversed biased PN junction forms the common base-collector junction of the NPN and PNP devices. As the voltage increases, the leakage current increases when the PN junction begins avalanching. The junction voltage at which avalanching occurs is reduced by the highly doped N+ region 20A. The leakage current flow through the N well 20 resistor disposed between the base and emitter of the PNP thereby tending to turn on the PNP device. The current is enhanced by the nMOS transistor formed by drain region 20A, sometimes referred to as a floating drain, and source region 30. This nMOS transistor, which is effectively connected in parallel with the NPN transistor, will produce an added current though the N well resistor 20 thereby adding to the current that turns on the PNP transistor. The LVTSCR turn on voltage or trigger voltage is represented by point 10A of FIG. 1.

Eventually, the increase in current in the PNP and NPN transistors will increase the current gain of the two devices so that each device will cause the other device to turn on. This regenerative SCR action will continue thereby reducing the voltage across the LVTSCR until the voltage drops to a holding voltage represented by point 10B of FIG. 1. As additional ESD current is conducted, the voltage across the LVTSCR will increase until the total IESD current is shunted through the device, as shown by point 10C of FIG. 1. Ideally, the device has sufficient current conduction capability so that the voltage never reaches the thermal breakdown voltage represented by point 10D.

The threshold voltage of the LVTSCR can be adjusted by various means, including controlling the gate-source voltage of the nMOS transistor. Gate 32 could by grounded thereby producing a relatively high threshold voltage. A resistive divider can also be used to bias the gate voltage. Further, an RC network can be used, with a capacitor of suitable size connected between the gate 32 and anode 28 and a resistor of suitable size being connected between the gate 32 and the cathode 36.

Although prior art ESD protection circuits, such as the LVTSCR 16 of FIGS. 2A and 2B provide adequate circuit protection in many applications, the required capabilities of such circuits have increase greatly with recent developments in newer integrated circuit designs.

DETAILED DESCRIPTION OF THE INVENTION

Figure 3A:
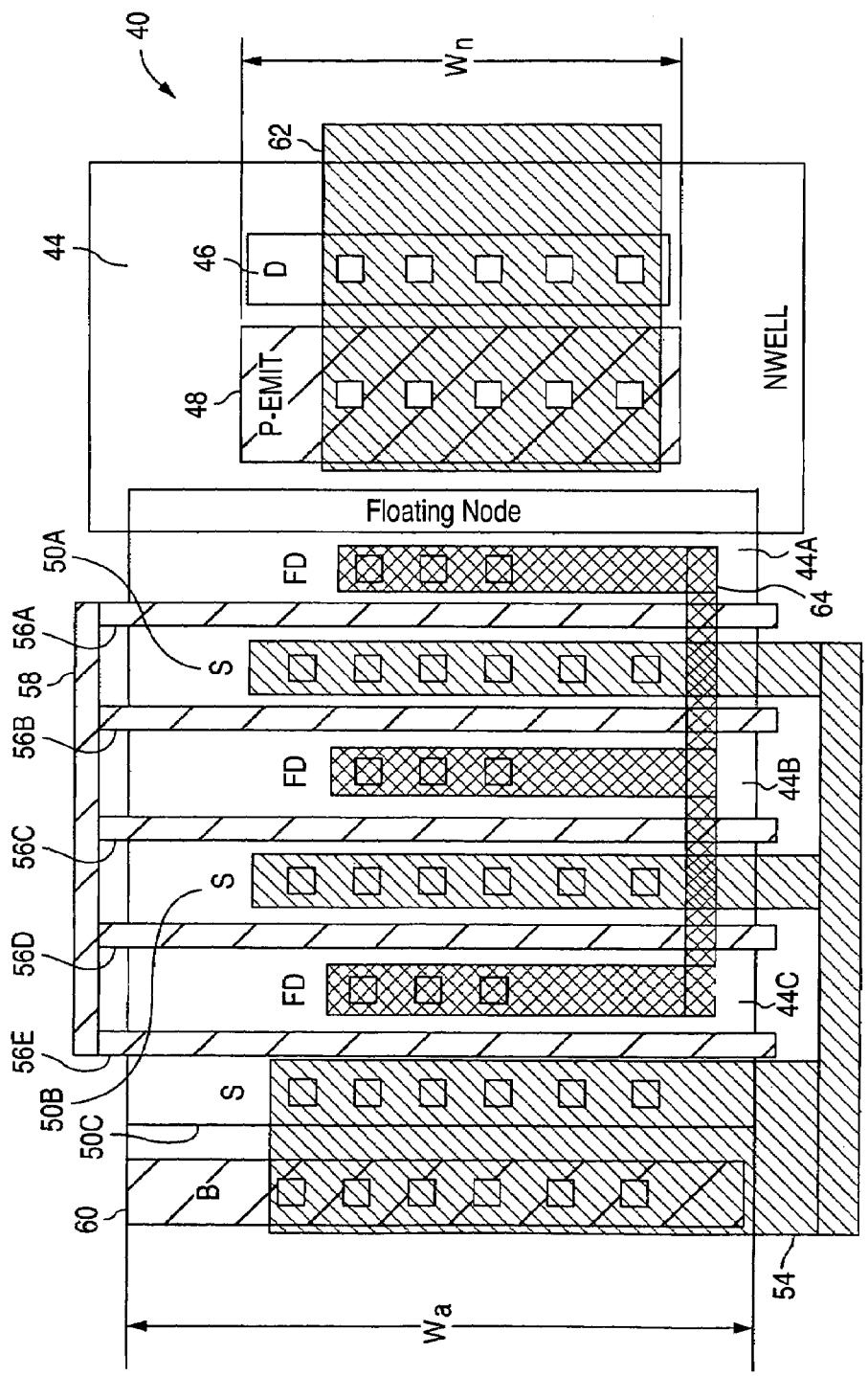
FIGS. 3A and 3B are respective simplified plan and elevational side views of a LVTSCR device in accordance with one embodiment of the present invention.
Figure 3B:
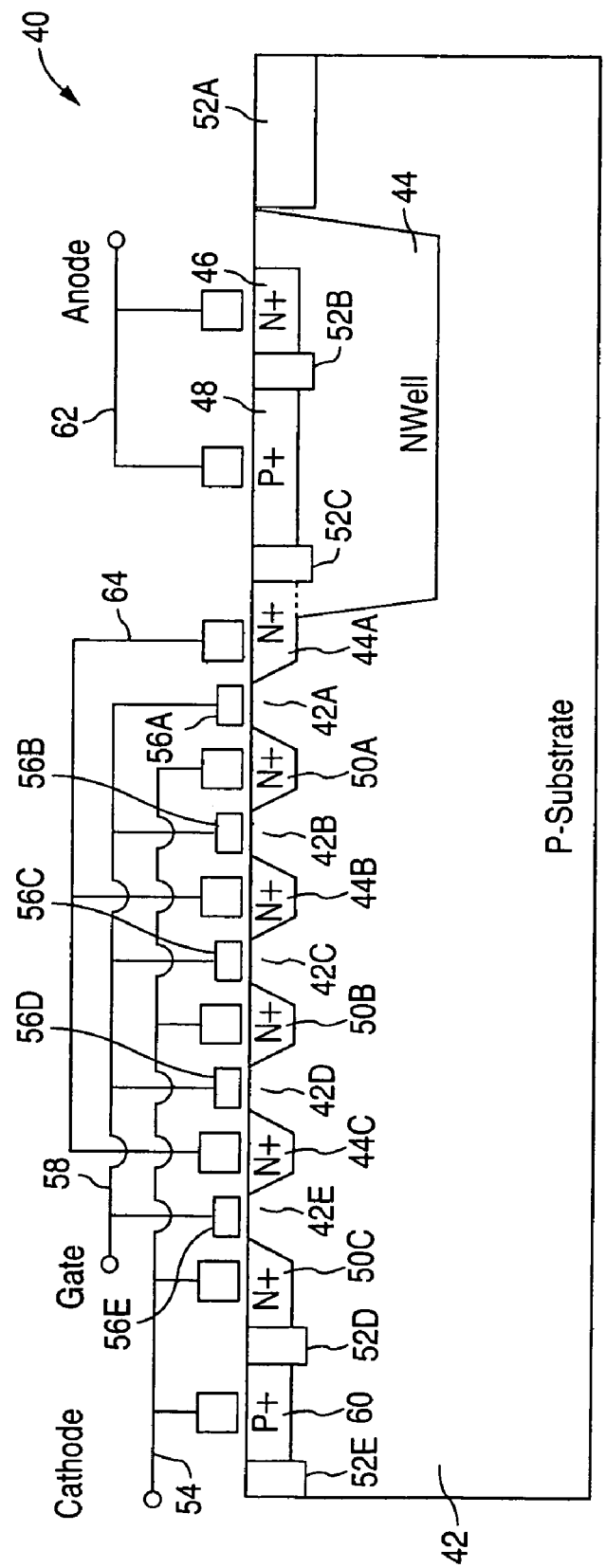

Referring again to the drawings, FIGS. 3A and 3B are simplified diagrams showing one embodiment 40 of the present improved ESD protection device. This embodiment is implemented in the form of a low voltage triggered silicon controlled rectifier (LVTSCR). The exemplary device is formed in a P type substrate 42. An N well 44 is provided, having an N+ region 46 for providing electrical contact to the N well. An P+ diffusion 48 is also formed in the N well, with respective N+ and P+ regions 46 and 48 being electrically interconnected by a metal track 62 which forms the anode terminal of the device.

An N+ region 44a extending from N well 44 forms one of three separate N+ floating drain regions or fingers of the device, with N+ regions 44B and 44C being the other two drain regions. The three drain region fingers are electrically interconnected by metal tracks 64. Three separate N+ source regions 50A, 50B and 50C or fingers are also formed in the P substrate 42 which are electrically interconnected by metal track 54, with track 54 also connecting the source regions to the cathode terminal of the device. Drain region 44A and source region 50A form a channel region 42A in the P substrate 42 near the surface of the substrate. A further drain region 44B is disposed intermediate source regions 50A and 50B so as to define further channel regions 42B and 42C in the P substrate 42. Finally, a drain region 44C is disposed intermediate source regions 50B and 50C to define channel regions 42D and 42E in the substrate. Polysilicon gates 56A, 56B, 56C, 56D and 56E are disposed above the respective channel regions 42A, 42B, 42C, 42D and 42E. The gates are electrically interconnected by a polysilicon interconnect 58. Thus, a multi-fingered nMOS transistor is formed having three electrically interconnected N type source region fingers, three electrically interconnected N type drain region fingers and five electrically interconnected gate electrodes. The interconnect 58 to the gate electrodes can be used as a trigger input to the LVTSCR device 40 as will be described below.

A P+ region 60 is also formed in the P substrate 42 to form an electrical contact to the substrate. P+ region 60 is also interconnected by metal track to the source regions 50A, 50B, 50C, 50D and 50E and the cathode. Typically, metal tracks 54 and 64 are formed on different metal layers of the device. Shallow trench isolation (STI) regions 52A, 52C, 52D and 52E are suitably formed to provide isolation between the various active elements of the device.

In operation, device 40 is connected in parallel with a device to be protected, with the anode terminal 62 being connected to positive voltage node and the cathode terminal 54 being connected to a negative voltage or common voltage node. Device 40 can be analogized to other four layer snap back devices and viewed as including merged PNP and NPN transistors having common base and collector regions. P+ region 48 and the N+ regions 44, 44A, 44B and 44CD form the emitter of the PNP device. The base of the PNP device is formed by N well 44 together with the N+ drain regions 44A, 44B and 44C. The P+ substrate 42 forms the PNP collector. The NPN device emitter is formed by interconnected N+ regions 50A, 50B and 50C, the base is formed by P substrate 42 and the collector by interconnected N+ regions 44, 44A, 44B and 44C.

Figure 1:
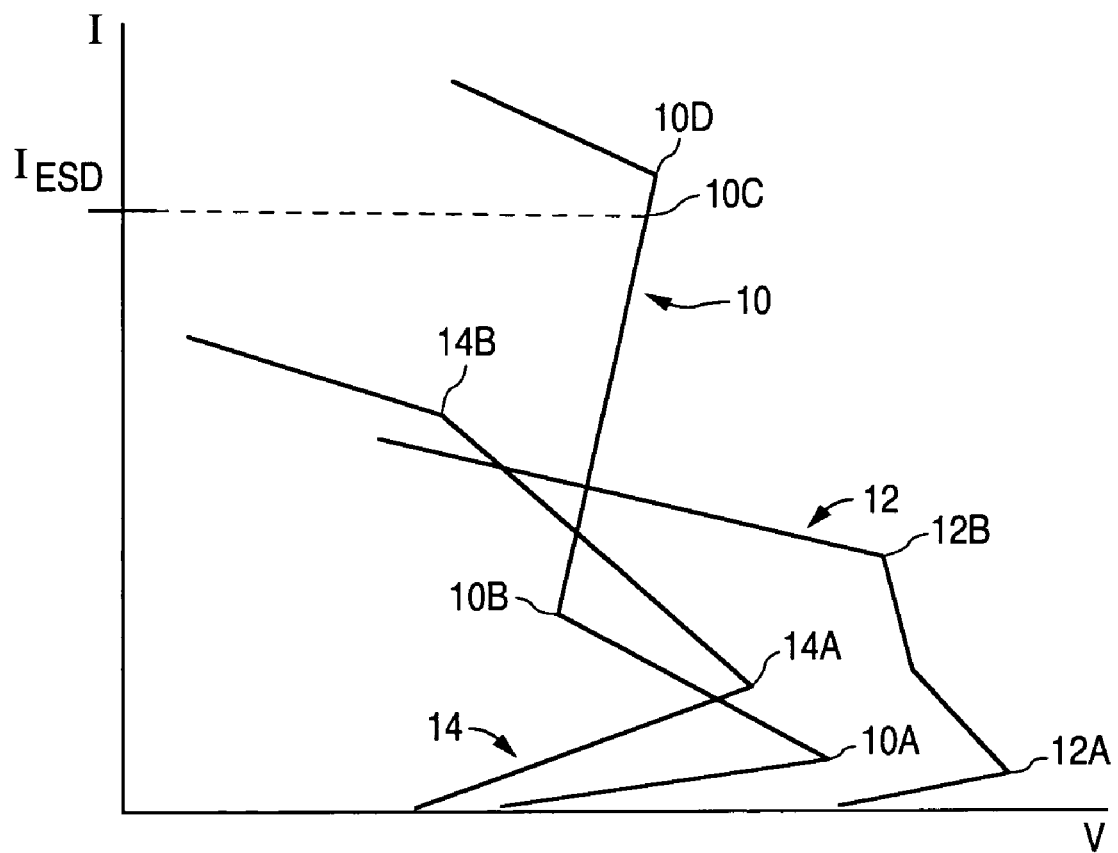
FIG. 1 is a graph illustrating the voltage—current characteristics of a typical prior art ESD protection circuit and characteristics of exemplary circuits to be protected by such ESD protection circuit.
Figure 2A:
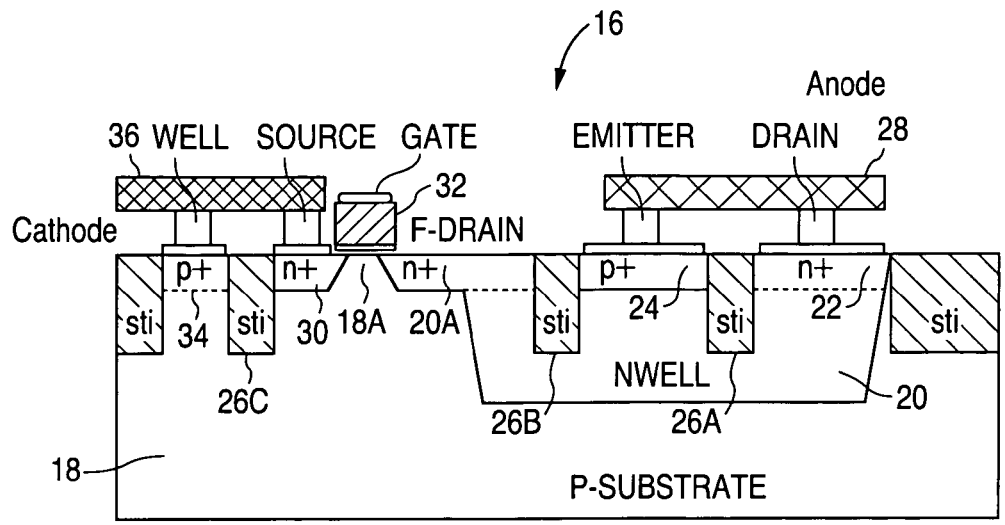
FIGS. 2A and 2B are respective simplified side elevational and plan views of a prior art LVTSCR device commonly used for ESD protection.
Figure 2B:
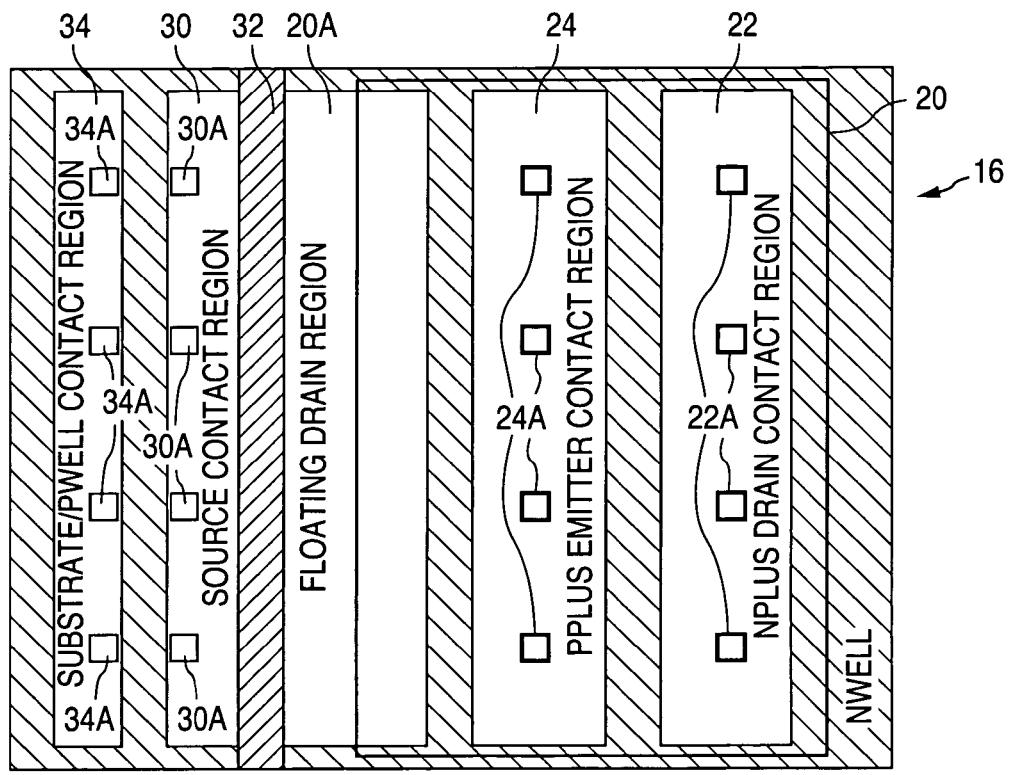

When an ESD event occurs, the positive voltage at the anode terminal 62 will cause the common base-collector junction of the NPN and PNP devices to reverse bias. This common junction is formed by electrically interconnected N regions 44, 44A, 44B and 44C and by the P substrate 42. As previously noted in connection with prior art FIGS. 2A and 2B, as the magnitude of the reverse bias voltage increases, a small reverse biased junction current begins to flow. The magnitude of this current would be proportional to the area of the junction if the voltage were uniform over all parts of the junction. However, that is usually not the case, as will be described below.

Given that current flow through device 40, between anode terminal 62 and cathode terminal 54 is generally lateral in nature, the width of the various PN junctions is the most relevant dimension relating to reverse biased current magnitude. As can be seen in FIG. 3A, the width Wa of each of the 44A, 44B, 44C and 44D N regions is strongly related to the magnitude of the reverse biased junction current for a given reverse bias voltage. Inspection of FIG. 3B shows that N region 44A provides a PN junction relative to the P substrate 42 having a width Wa. N region 44B provides twice the junction widths Wa since there are essentially two separate junctions on opposite sides of the region 44B. The same is true for N region 44C. Thus, the total effective junction width, Wp, is five times the value of Wa. Thus, the reverse biased leakage current will be approximately five times that which would be produced if only N drain extension 44A were present.

The leakage or avalanche current flow along effective width Wp will provide the current for turning on the PNP transistor that includes the P+ region 48 as the emitter of the transistor. The P+ emitter 48 and P substrate 42 base of the PNP transistor provide a junction having a width of only Wn as can be seen in FIG. 3A. It can be seen by inspection that Wn is smaller than Wa so that five times Wa, the effective junction width Wp, is greater than five times the value of Wn. For a given magnitude of leakage current produced by the reversed biased junction having effective width Wp, such magnitude current will tend to turn on the relatively small PNP transistor having an emitter junction width of only Wn at a significantly lower reverse bias voltage, that is, a lower anode to cathode voltage. Once the PNP transistor begins to turn on, the NPN transistor will also begin to turn on which, in turn, will cause the NPN to turn on harder so that the SCR is essentially triggered. Thus, the trigger voltage of the LTVSCR device of FIGS. 3A and 3B is substantially reduced.

In addition to the leakage or avalanche currents just described, the turn on current will be increased by the channel current flowing in the five channel regions 42A, 42B, 42C, 42D and 42E of the multi-fingered nMOS transistor. This nMOS transistor will produce, for similar operating conditions, a five-fold increase in current over the nMOS transistor of the prior art FIGS. 2A and 2B device and thus further reduce the trigger voltage for the subject LVTSCR device 40. The common gate connection 58 can be connected to various drive circuits to allow further adjustment in the trigger voltage. For example, the gate connection 58 can be connected to the cathode 54 through a resistor. Alternatively, an RC circuit can be used to drive the device, typically with the capacitor of suitable size being connected between the gate and anode and a resistor of suitable size being connected between the gate and the cathode.

In order to obtain at least some of the advantages of the subject invention, the ratio of effective feature widths Wp to Wn should be at least 1.5 to 1 and preferably at least 2 to 1.

Figure 4A:
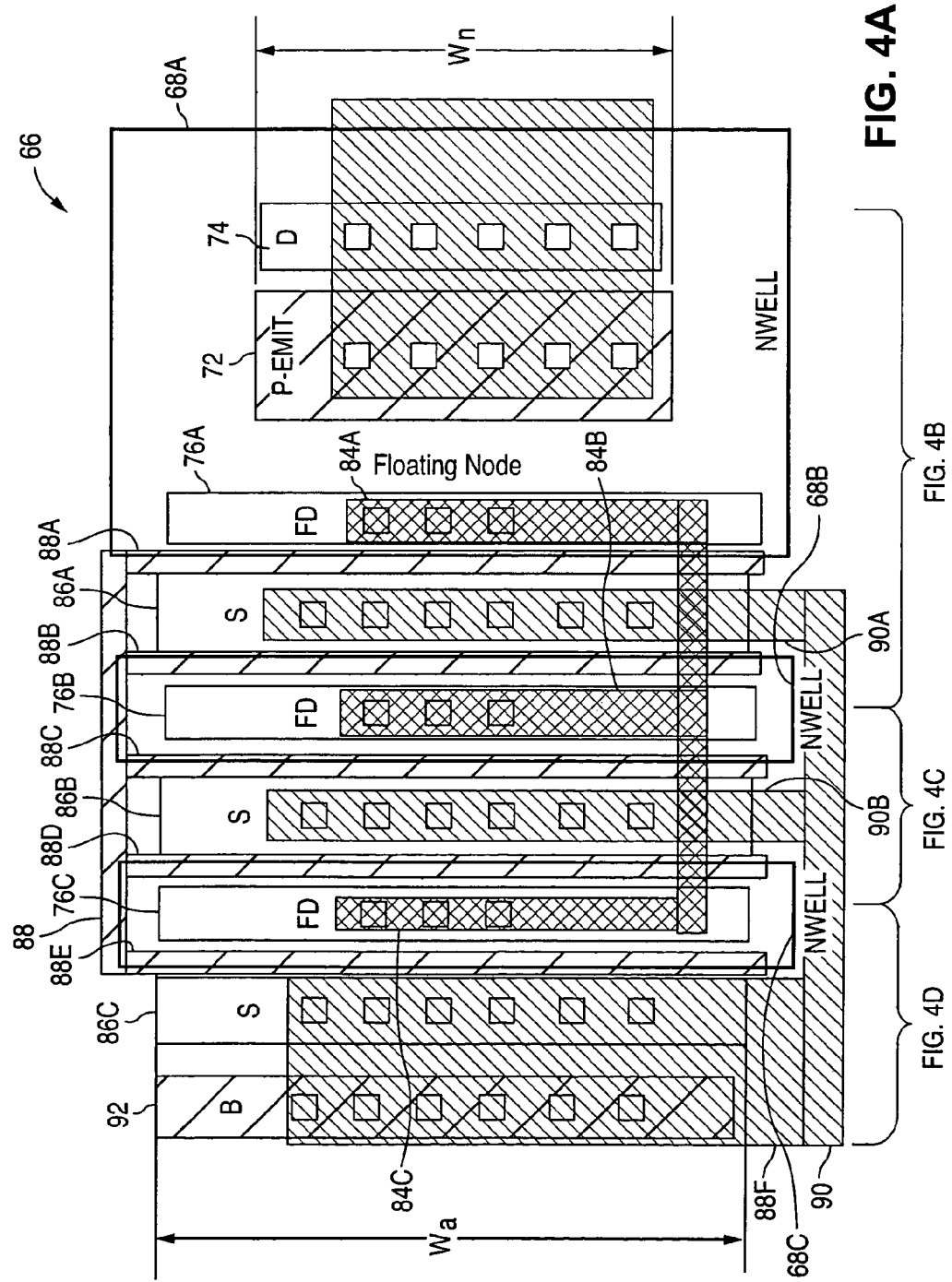
FIGS. 4A, 4B, 4C and 4D are various simplified views of an LDMOS-SCR device in accordance with a further embodiment of the present invention, with FIG. 4A being a plan view and FIGS. 4B, 4C and 4D each being a section of a elevational side view.
Figure 4B:
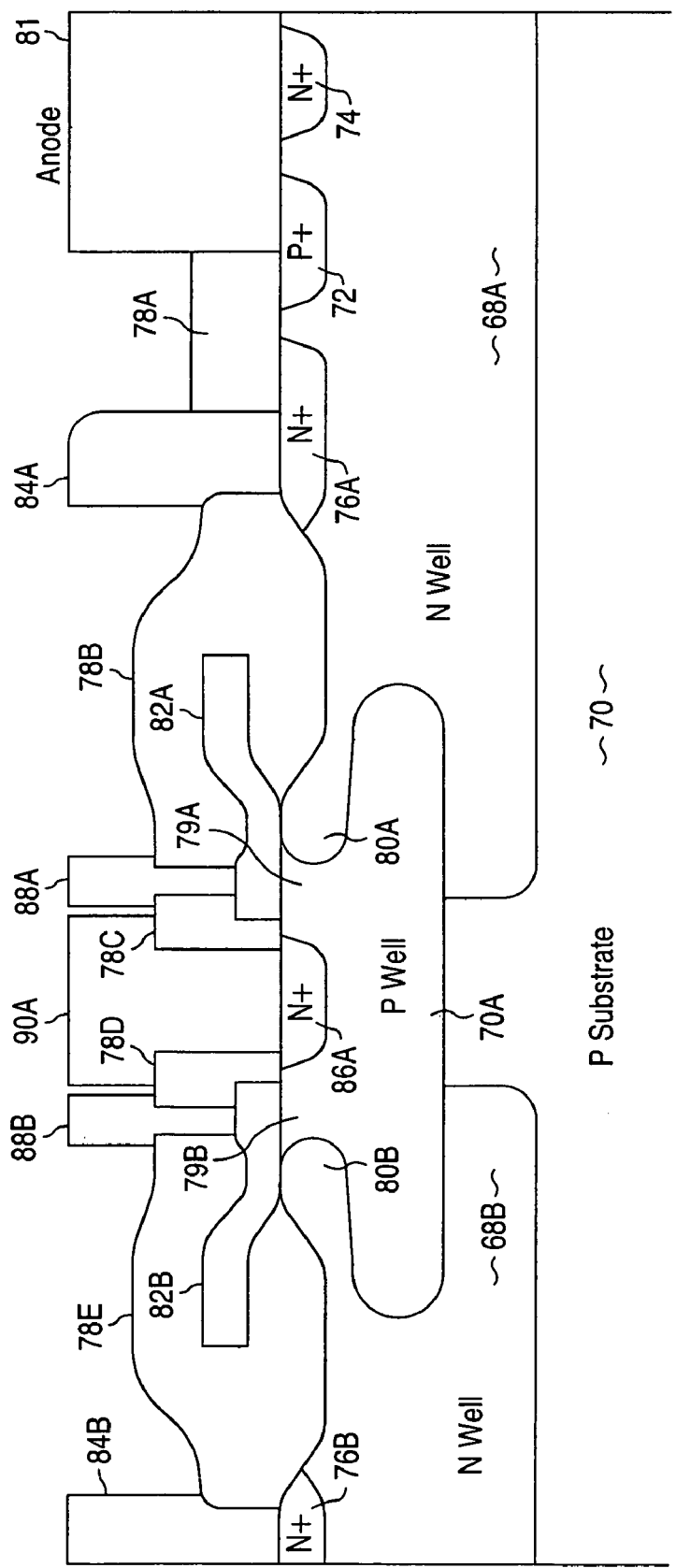

A further embodiment of the present invention, an LDMOS-SCR device 66 is shown in FIGS. 4A, 4B, 4C and 4D. This SCR device uses a laterally diffused MOS (LDMOS) transistor structure. FIG. 4A is a topological view of the subject LDMOS-SCR and FIGS. 4B, 4C and 4C each show segments of a cross-section of the device. In the present exemplary embodiment, device 66 is formed in a P type substrate 70. A first N well 68A (FIG. 4B) is disposed in the P substrate 70 with N+ region 74 permitting an electrical contact to the well. A P type region 72 is also formed in the N well and is electrically interconnected to the N+ region 74 and hence the N well 68A by a metal track 81. Metal track 81 forms the SCR device anode terminal.

A P well 70A is formed in substrate 70 (FIGS. 4A, 4B) so as to define an N type extension 80A in the N well 68A that will act as a drain region of the LDMOS transistor structure. An N+ region 76A, in combination with metal track 84A, are used to provide an electrical contact with the drain 80A. An N+ region 86A if formed in the P well 70A to form a common source region for two LDMOS structures. A metal track 90A provides electrical contact to the source region 86A. Source region 86A and drain region 80A define a first channel region 79A in the P well. A doped polysilicon gate electrode 82A is disposed over the channel region. Field oxide regions 78A, 78B and 78C typically present in LDMOS structures are also used. A metal track 88A is connected to the gate electrode A further N well 68B (FIGS. 4A, 4B and 4C) is formed in the P substrate 70. P well 70A causes an N type drain extension 80B to be formed, with electrical contact to the drain extension being provided by N+ region 76B and metal contact 84B. As can be seen in FIG. 4A, metal contact 84A and contact 84B are electrically interconnected with other drain regions to be described. A second channel region 79B is formed in the P well intermediate the common source region 86A and the drain region 80B. A polysilicon gate electrode 82B is disposed over channel region 79B having an associated metal track 88B. As can be seen in FIG. 4A, the poly gate electrodes 82A, 82B and other gate electrodes to be described are electrically interconnected.

Figure 4C:
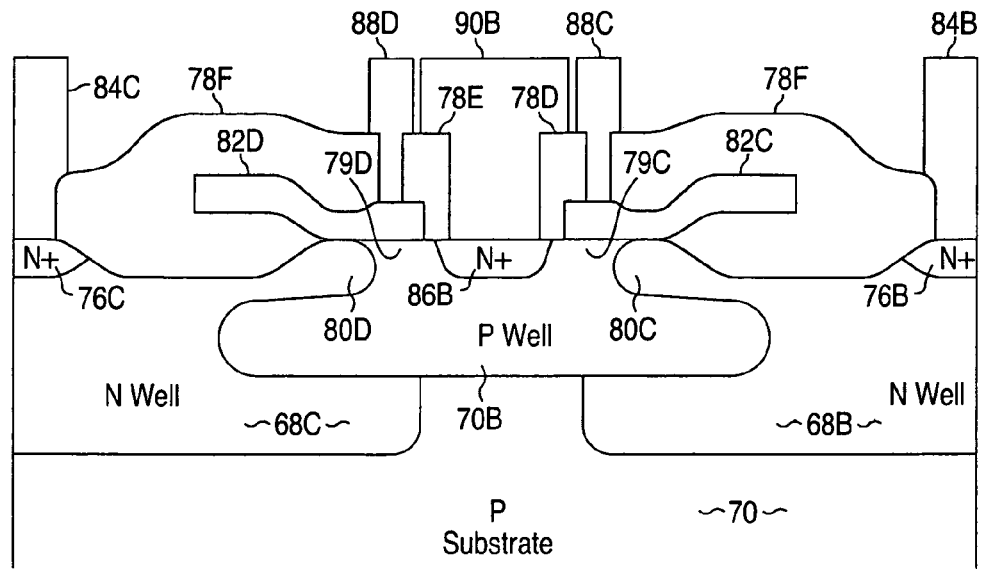
Figure 4D:
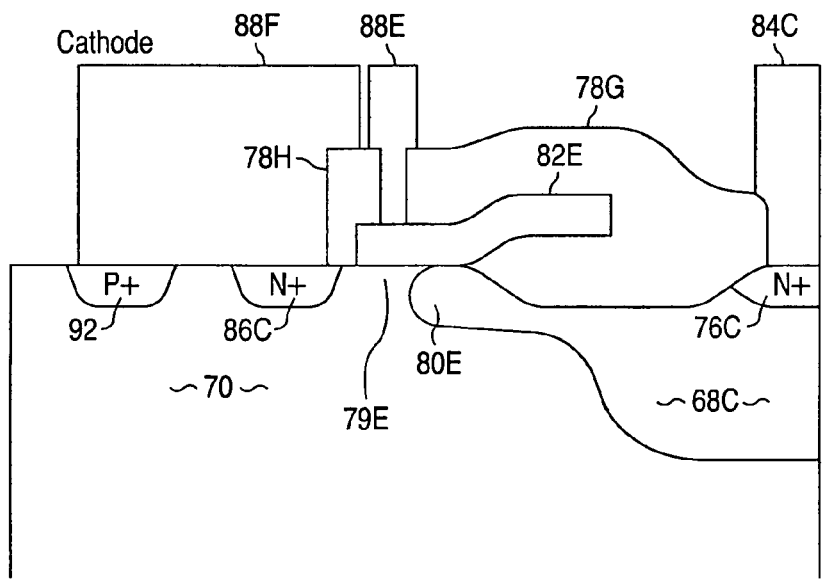

As shown in FIG. 4C, N well 68B includes a second drain extension 80C formed over a second P well 70B. An N+ source region 86B is formed in the P well 70B that defines a further channel region 79C in the P well. Metal track 90B provides electrical connection to the source region 86B and, along with the other source region to be described, is electrically interconnected to track 90A of source region 86A. A polysilicon gate electrode 82C is disposed over the channel region 79C and is, as described above, interconnected with the other gate electrodes by way of metal track 88C.

A third N well 68C is present (FIGS. 4A, 4C and 4D) in the P substrate to provide a pair of opposing drain extensions 80D and 80E. An N+ region 76C and metal track 84C provide electrical contact to drains 80D and 80E and the other drains of the device 66. An N+ source region 86C is formed in the P substrate 70 thereby defining a channel region 79E in the substrate. A polysilicon gate electrode is disposed above the channel region 79E and electrically interconnected with the other gate electrodes by way of metal track 88E. P+ region 92, together with metal track 88F, provide an electrical connection to the P substrate 70 and to source region 86C. Metal track 88F also functions as the device cathode terminal. Source region 86C is electrically interconnected to the other source regions by metal track 90 as shown in FIG. 4A.

In operation, LDMOS-SCR device 66 includes various regions that form merged PNP and NPN devices as previously described in connection with device 40 of FIG. 3A. P+ region 72 forms the emitter of the PNP device, with N well 68A forming the base and the P substrate 70 and P wells 70A, 70B and 70C contributing to the collector. The NPN device is defined by the electrically interconnected N+ source regions 86A, 86B and 86C that form the emitter, the P wells 70A, 70B and 70C and P substrate 70 that contribute to the base and the N wells 68A, 68B and 68C that contribute to the collector.

When an ESD voltage is imposed across device 66, the voltage will tend to reverse bias the PN junction formed by the N wells 68A, 68B and 68C and the P wells 70A, 70B and P substrate 70. Using substantially the same analysis as previously used in connection with device 40 of FIG. 3A, it can be seen that the effective width Wa of the individual regions of the device 66 that form the reversed biased PN junction is increased by a factor of 5 so that the total effective junction width Wp is five times Wa. Inspection of FIG. 4A indicates that width Wn is less than Wa so that Wp will be greater than five time Wa. The result is a lower threshold voltage of device 66. Further, the resultant LDMOS transistor structure defined by the electrically interconnected drain regions 76A, 76B and 76C, the electrically interconnected source regions 86A, 86B and 86C and the electrically interconnected gate electrodes 82A, 82B, 82C, 82D and 82E creates a total channel current that adds to the leakage or avalanche current and thereby substantially further reducing the device 66 threshold voltage. The common gate electrode connection 90 can be used as a driver input, using either a resistor network or an RC network as previously described.

Figure 5A:
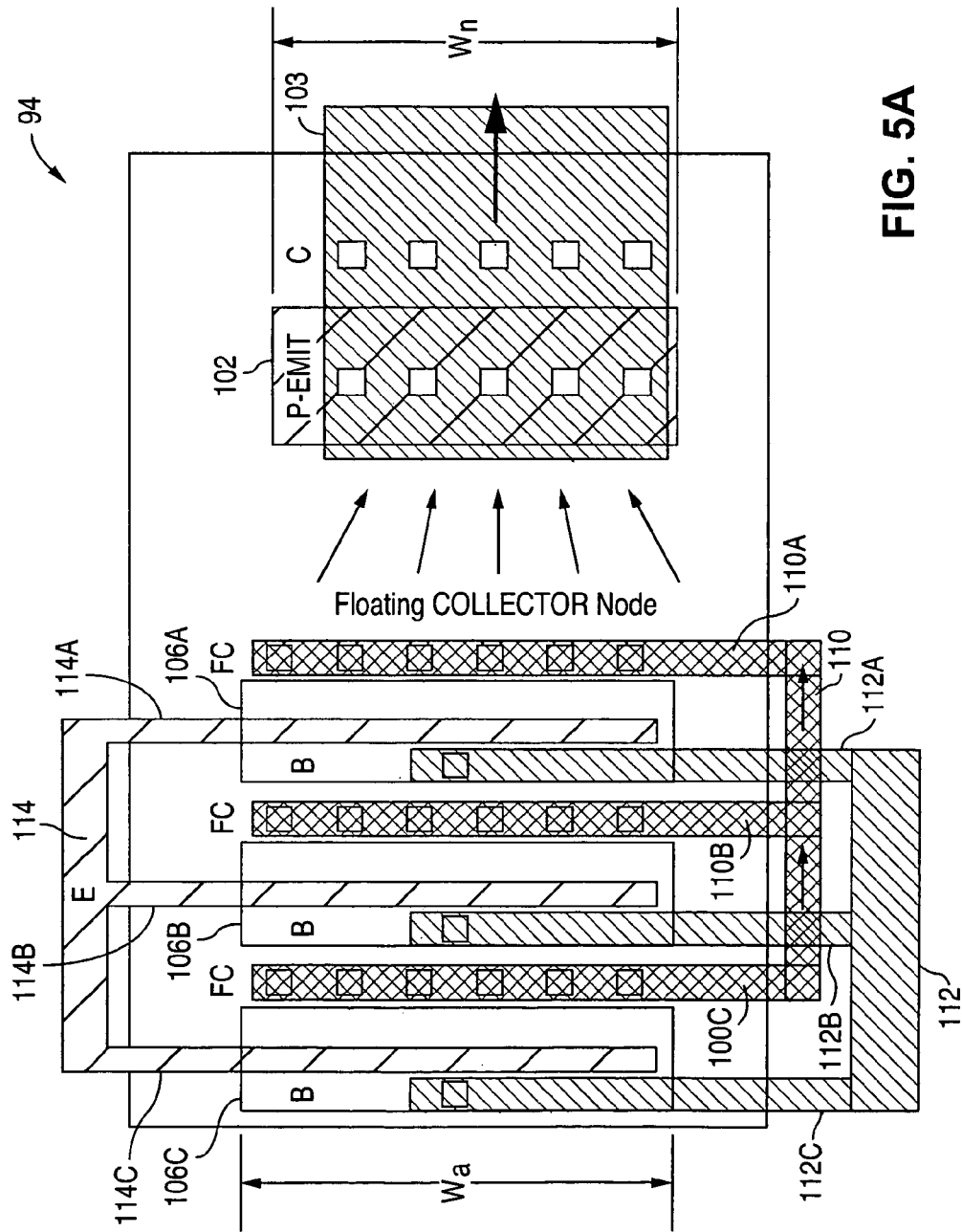
FIGS. 5A and 5B are respective simplified plan and elevational side views of a BSCR device in accordance with a still further embodiment of the present invention.
Figure 5B:
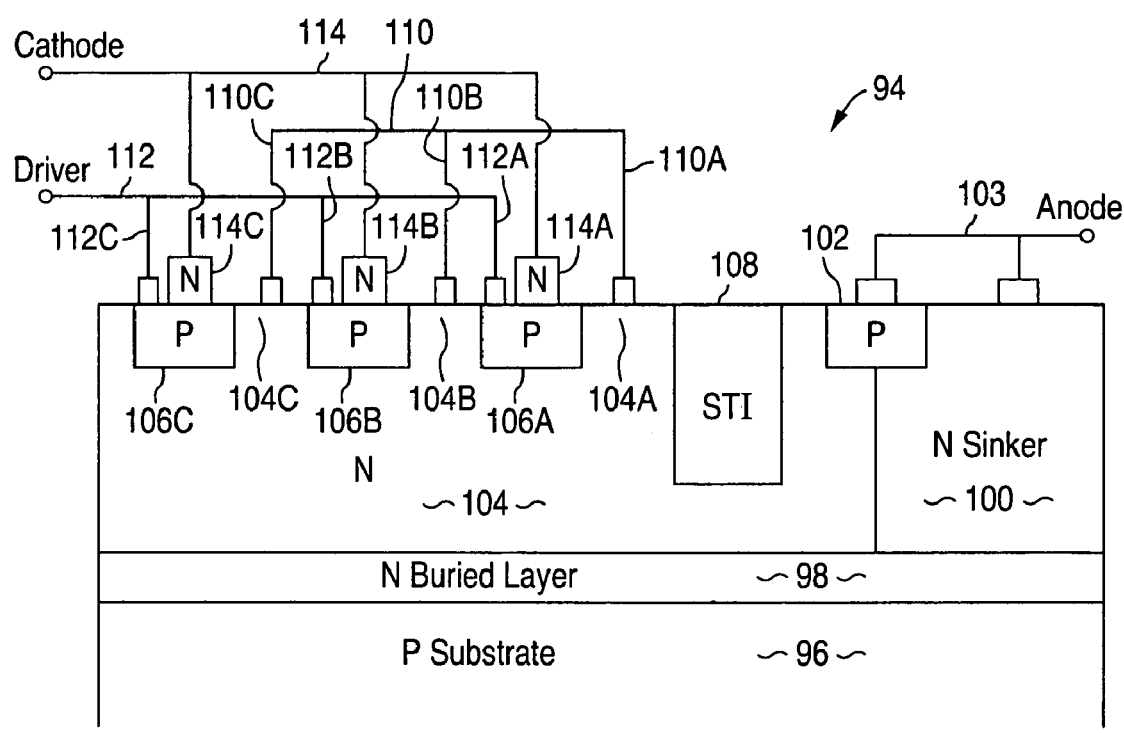

A third embodiment of the present invention is a bipolar SCR (BSCR) device 94 shown in FIGS. 5A and 5B. Exemplary device 94 is formed in a P type substrate 96 having an N type buried layer 98 to promote lateral current flow. An N type region 104 is formed above the buried layer. An N type sinker 100 is provided so as to provide an improved electrical connection to the buried layer 98. A P type region 102 is disposed in the N regions and is electrically interconnected to the N sinker 100 by a metal track 103, with track 103 forming the anode terminal of the device. Three separate and spaced apart P type regions 106A, 106B and 106C are formed in the N region 104 and are electrically interconnected by metal tracks 112A, 112B, 112C and 112. A shallow trench isolation region 108 is located intermediate the three P type regions 106A, 106B and 106C and the P type region 102. Three N type doped polysilicon segments 114A, 114B and 114C are disposed on the respective P regions 106A, 106B and 106C and are electrically interconnected by a polysilicon segment 114. Segment 114 further interconnects the P regions to the cathode terminal of the SCR device 94. Metal tracks 110A, 110B and 110C make respective electrical connections to N type region 104 at three locations 104A, 104B and 104C adjacent the P type regions 106A, 106B and 106C, with the metal tracks being electrically interconnected by metal track 110.

Again, SCR device 94 can be viewed as including merged PNP and NPN devices. The emitter of the PNP device is formed by P type region 102, with the base being the various N type regions 100, 98, 104, 104A, 104B and 104C. The PNP device collector is formed by the electrically interconnected connected P type regions 106A, 106B and 106C. The emitter of the NPN structure includes the thee N type polysilicon segments 114A, 114B and 114C. The NPN base regions are formed by P regions 106A, 106B and 106C. The collector, sometimes referred to as the floating collector, includes the N regions 104 and the interconnected 104A, 104B and 104C N regions.

When an ESD event is imposed across the SCR device 94 of appropriate polarity, the PN junction formed by the various N type regions including 104, 104A, 104B and 104C and the three P type regions 106A, 106B and 106C will be reversed biased. As can be seen in FIG. 5A, the length Wa of each of the three individual P type regions is somewhat greater than the length Wa of the P type region 102. Accordingly, the total effective length Wp of the P regions is five times Wa. Thus, the trigger voltage for the BSCR device 94 will be substantially reduced.

Thus, three embodiments of an improved SCR device have been disclosed. Although these embodiments have been described in some detail, it is to be understood that certain changes can be made by those skilled in the art without departing from the spirit and scope of the invention as set forth in the appended claims.

The invention claimed is:

1. An SCR device having an anode terminal and a cathode terminal, said device comprising:
   a semiconductor body having a first surface;
   a first P type semiconductor region electrically connected to the anode terminal;
   at least one N type semiconductor region disposed in the semiconductor body, with the first P type semiconductor region and the at least one N type semiconductor region forming at least one PN junction, with the at least one PN junction having a total width Wn near the first surface and which is in a direction substantially normal to current flow between the anode and the cathode and which conducts a substantial portion of current flow between the first P type region and the at least one N type region;
   at least one further P type semiconductor region disposed in the semiconductor body, with the at least one N type semiconductor region and the at least one further P type region forming at least one PN junction having a total width Wp near the first surface in the direction normal to the current flow between the anode and cathode, with width Wp being at least 1.5 times width Wn;
   at least one further N type semiconductor region electrically connected to the cathode terminal, with the at least one further P type semiconductor region and the at least one further N type semiconductor region forming at least one PN junction there between and wherein a four layer PNPN structure is formed by the first P type, the at least one N type, the at least one further P type and the at least one further N type semiconductor regions.

2. The SCR device of claim 1 further comprising an electrical connection between the at least one N type semiconductor region and the anode terminal and another electrical connection between the at least one further P type semiconductor region and the cathode terminal.

3. The SCR device of claim 1 wherein the at least one further N type semiconductor region is disposed in the semiconductor body and wherein a channel region is disposed in the at least one further P type semiconductor region, adjacent the first surface and intermediate the at least one N type semiconductor region and the at least one further N type semiconductor region and wherein the SCR device further includes a gate electrode disposed over the channel region.

4. The SCR device of claim 3 wherein the at least one N type semiconductor region, the at least one further N type semiconductor region and the gate electrode are respectfully configured to form an LDMOS transistor structure.

5. The SCR device of claim 1 wherein the at least one N type semiconductor region is disposed in the semiconductor body and includes at least two N type regions spaced apart from one another and electrically interconnected, with said at least two N type regions and the at least one further P type region forming at least three PN junctions having a total width which is at least part of the total width Wp near the first surface in the direction normal to the current flow between the anode and cathode.

6. The SCR device of claim 5 wherein the at least one further N type semiconductor region is disposed intermediate the at least two N type regions so as to form first and second channel regions in the at least one further P type semiconductor region adjacent the first surface and wherein the SCR device further includes first and second gate electrodes disposed over the respective first and second channel regions, with the first and second gate electrodes being electrically interconnected.

7. The SCR device of claim 6 wherein the at least two N type semiconductor regions, the at least one further N type region and the first and second gate electrodes are configured to form an LDMOS transistor structure.

8. The SCR device of claim 1 wherein the at least one N type semiconductor region includes at least first, second and third N type semiconductor regions spaced apart from one another and electrically interconnected, with said at least first, second and third N type semiconductor regions and the at least one further P type semiconductor region forming at least five PN junctions having a total width which is at least part of the total width Wp adjacent the first surface and in the direction normal to current flow between the anode and the cathode.

9. The SCR device of claim 8 wherein the at least one further N type semiconductor region is disposed in the semiconductor body and includes at least first and second further N type regions semiconductor regions spaced apart from one another and electrically interconnected, with the at least first further N type semiconductor region being disposed intermediate the at least first and at least second N type semiconductor regions to form first and second respective channel regions in the at least one further P type semiconductor region and with the at least second further N type semiconductor region being disposed intermediate the at least second and the at least third N type semiconductor regions to form third and fourth respective channels in the at least one further P type semiconductor region.

10. The SCR device of claim 9 further including electrically interconnected first, second, third and fourth gate electrodes disposed over the respective first, second, third and fourth channel regions.

11. The SCR device of claim 1 wherein at least one further P type semiconductor region includes at least first and second further P type semiconductor regions spaced apart from one another and electrically interconnected and wherein the at least one further N type semiconductor region includes at least first and second further N type semiconductor regions spaced apart from one another and electrically interconnected, with the at least first further N type semiconductor region forming a PN junction with the at least first further P type semiconductor region and with the at least second further N type semiconductor region forming a PN junction with the at least second further P type semiconductor region.

12. The SCR device of claim 11 wherein the first and second further P type semiconductor regions include doped polysilicon.

13. An SCR device having an anode terminal and a cathode terminal, said device comprising:
a semiconductor body having a first surface;
a single P type semiconductor region electrically connected to the anode terminal;
at least one N type semiconductor region disposed in the semiconductor body and forming a PN junction with the single P type semiconductor region;
at least one P type semiconductor region disposed in the semiconductor body and forming at least one PN junction with the at least one N type semiconductor region, with there being a total of at least three separate ones of the at least one N type semiconductor regions and the at least one P type semiconductor regions, with all separate ones of the N type semiconductor regions being electrically interconnected and with all separate ones of the P type semiconductor regions being electrically interconnected; and
at least one further N type semiconductor region electrically connected to the cathode terminal and forming at least one PN junction with the at least one P type semiconductor region and wherein an PNPN structure is formed by the single P type, the at least one N type, the at least one P type and the at least one further N type semiconductor regions.

14. The SCR device of claim 13 wherein the at least one N type semiconductor region includes at least first and second separate N type semiconductor regions, with at least the second separate N type semiconductor region being electrically interconnected with the first separate N type semiconductor region and further being disposed in the at least one P type semiconductor regions.

15. The SCR device of claim 14 wherein the at least one further N type region is disposed intermediate the first and second separate N type semiconductor regions so as to form first and second channel regions in the at least one P type semiconductor region near the first surface and with the SCR device further including first and second gate electrodes disposed over respective ones of the first and second channel regions, with the first and second gate electrodes being electrically interconnected.

16. The SCR device of claim 15 wherein the at least one further N type semiconductor region includes a second further N type semiconductor region disposed in the at least one P type semiconductor region so as to form a third channel region in the at least one P type semiconductor region near the first surface intermediate the second further N type semiconductor region and the second separate N type semiconductor region, with the further N type semiconductor regions being electrically interconnected and with the SCR device further including a third gate electrode disposed over the third channel region and electrically interconnected with the first and second gate electrodes.

17. The SCR device of claim 16 wherein the at least one further N type semiconductor region further includes a third further N type semiconductor region disposed in the at least one P type semiconductor region and electrically interconnected with the at least one further and second further N type semiconductor regions and a third separate N type semiconductor region disposed in the at least one P type semiconductor region and electrically interconnected with the first and second separate N type semiconductor regions and wherein a fourth channel region is formed in the at least one P type semiconductor region near the first surface intermediate the third separate N type semiconductor region and the second further N type semiconductor region and a fifth channel region is formed in the at least one P type semiconductor region intermediate the third separate N type semiconductor region and the third further N type semiconductor region, with the SCR device further including fourth and fifth gate electrodes disposed over the respective fourth and fifth channel regions, with the first, second, third, fourth and fifth gate electrodes being electrically interconnected.

18. The SCR device of claim 13 wherein the at least one P type semiconductor region includes first and second separate P type semiconductor regions electrically interconnected and wherein the at least one further N type semiconductor regions includes first and second separate further N type semiconductor regions electrically interconnected, with the first separate further N type region forming a PN junction with the first separate P type semiconductor region and with the second separate further N type semiconductor region forming a PN junction with the second separate P type semiconductor region.

19. The SCR device of claim 18 wherein the first and second separate further N type regions each include doped polysilicon and wherein the first and second separate P type semiconductor regions are formed in a common one of the at least one N type semiconductor regions.

20. The SCR device of claim 18 wherein the at least on P type semiconductor region includes a third separate P type semiconductor region electrically interconnected with the first and second separate P type semiconductor regions and wherein the at least one further N type semiconductor region includes a third separate further N type semiconductor region electrically interconnected with the first and second separate N type semiconductor regions, with the third separate further N type semiconductor region forming a PN junction with the third separate P type semiconductor region.

21. The SCR device of claim 20 wherein the first, second and third separate further N type regions each include doped polysilicon and wherein the first, second and third separate P type semiconductor regions are formed in a common one of the at least one N type semiconductor regions.

22. An SCR device having an anode terminal and a cathode terminal, said device comprising:
    a P type semiconductor region electrically connected to the anode terminal;
    a plurality of separate N type semiconductor regions electrically interconnected with one another, with at least one of the separate N type semiconductor regions forming a PN junction with the P type semiconductor region;
    a second P type semiconductor region, with at least one of the plurality of separate N type semiconductor regions being disposed in the second P type semiconductor region so as to form a PN junction between the second P type semiconductor region and the at least one of a plurality of separate N type semiconductor regions;
    at least one N type semiconductor region electrically connected to the cathode terminal and disposed in the second P type semiconductor region so as to form a PN junction with the second P type semiconductor region, with the plurality of separate N type semiconductor regions and the at least one N type semiconductor region forming at least first and second channel regions in the second P type semiconductor region, with the first channel region being disposed intermediate a first one of the separate N type regions and the at least one N type semiconductor region and with the second channel region being disposed intermediate a second one of the separate N type semiconductor regions and the at least one N type semiconductor region; and
    first and second electrically interconnected gate electrodes disposed over the respective first and second channel regions and wherein a PNPN structure is formed by the P type, the plurality of separate N type, the second P type and the at least one N type semiconductor regions.

23. The SCR device of claim 22 wherein the plurality of separate N type semiconductor regions includes a third one of the separate N type semiconductor regions disposed in the second P type semiconductor region and wherein the at least one N type semiconductor regions includes first, second and third N type semiconductor regions, with the first N type semiconductor region being disposed in the second P type semiconductor region to form the first and second channel regions intermediate the first N type semiconductor region and the respective first and second separate N type semiconductor regions, with the second N type semiconductor region being disposed intermediate the second and third separate N type semiconductor regions to form a third channel region in the second P type semiconductor region intermediate the second separate N type semiconductor region and the second N type semiconductor region and to form a fourth channel region in the second P type semiconductor region intermediate the second N type semiconductor region and the third separate N type semiconductor region and with the third N type semiconductor region being disposed to form a fifth channel region in the second P type semiconductor region intermediate the third N type semiconductor region and the third separate N type semiconductor region; and
    third, fourth and fifth gate electrodes interconnected with the first and second gate electrodes and disposed over the respective third, fourth and fifth channel regions.

* * * * *

UNITED STATES PATENT AND TRADEMARK OFFICE
CERTIFICATE OF CORRECTION

PATENT NO.         : 7,141,831 B1                                            Page 1 of 1
APPLICATION NO. : 10/900709
DATED              : November 28, 2006
INVENTOR(S)        : Vladislav Vashchenko et al.

It is certified that error appears in the above-identified patent and that said Letters Patent is hereby corrected as shown below:

In Column 11, line 19, "on" should be deleted and replaced with --one--.

Signed and Sealed this

Sixth Day of March, 2007

JON W. DUDAS
*Director of the United States Patent and Trademark Office*